United States Patent [19]

Foss

[11] Patent Number: 4,786,830

[45] Date of Patent: Nov. 22, 1988

[54] CMOS INPUT BUFFER CIRCUIT FOR TTL SIGNALS

[75] Inventor: Richard C. Foss, Kanata, Canada

[73] Assignee: U.S. Philips Corporation, New York, N.Y.

[21] Appl. No.: 65,199

[22] Filed: Jun. 22, 1987

[30] Foreign Application Priority Data

Jun. 25, 1986 [GB] United Kingdom ............... 8615467

[51] Int. Cl.⁴ ............................................. H03K 17/30
[52] U.S. Cl. .................................... 307/475; 307/451; 307/554; 307/264
[58] Field of Search ............... 307/443, 451, 475, 553, 307/554, 562, 272 R, 291, 264

[56] References Cited

U.S. PATENT DOCUMENTS

| 4,380,710 | 4/1983 | Cohen et al. | 307/451 X |
| 4,437,024 | 3/1984 | Wacyk | 307/475 |
| 4,471,242 | 9/1984 | Noufer et al. | 307/451 X |
| 4,501,978 | 2/1985 | Gentile et al. | 307/443 X |
| 4,558,237 | 12/1985 | Rabe et al. | 307/451 X |
| 4,563,595 | 1/1986 | Bose | 307/475 X |
| 4,584,491 | 4/1986 | Ulmer | 307/443 X |

Primary Examiner—Stanley D. Miller
Assistant Examiner—D. R. Hudspeth
Attorney, Agent, or Firm—Steven R. Biren

[57] ABSTRACT

A TTL to CMOS-input buffer has minimal sensitivity of threshold level variation with changes in device parameters. In particular, the design is insensitive to P-channel characteristics over very wide ranges of transistor threshold voltages and gain parameter spreads.

8 Claims, 2 Drawing Sheets

CMOS INPUT BUFFER CIRCUIT FOR TTL SIGNALS

BACKGROUND OF THE INVENTION

The invention is related to a CMOS input circuit.

The use of CMOS input circuits is widespread as such circuits are very frequently used in integrated circuits. As the integration density of such circuits increases and thus the device geometries decrease, significant parameter spreads occur. The noise induced by large currents flowing in ground- and supply lines may contribute to the difficulties in sensing logic (e.g. TTL-) one and zero levels. A tight control over the input switching thresholds is especially desirable.

Several solutions have been proposed, such as a CMOS-inverter, which is biassed from the positive and negative circuit supply terminals, such that the input threshold switching level of the CMOS-inverter is substantially independent of CMOS-device characteristics tolerance (See GB patent application No. 2.133.242A). The biassing means include a P- and an N-channel transistor, the P-channel transistor is connected between the N-channel transistor of the inverter and the negative supply terminal, and the N-channel transistor is connected between the P-channel transistor of the inverter and the positive supply terminal. The gates of the biassing P-channel and N-channel transistor are connected to the negative and the positive supply terminal respectively. Although the CMOS-input circuit according to the prior art has a switching threshold, which is substantially independent from transistor characteristics, the input circuit is hampered with some drawbacks. Notably the use of additional transistors, especially P-channel transistors, increases the circuit area on the semiconductor chip, on which the circuit is to be integrated. Further the use of the biassing transistors adds an offset to the N-type transistor of the inverter equal to the P-type transistor threshold and an off set to the P-transistor of the inverter equal to the N-type transistor threshold, which renders the prior art input circuit unsuitable for TTL-level input signals and for use with low power supply voltages (e.g. 2-2.5 L Volt).

SUMMARY OF THE INVENTION

It is the object of the invention to provide a CMOS-input circuit, which is insensitive to P-channel transistor characteristics and very suitable for TTL-level input signals, and which can be used on low supply voltages.

A CMOS-input circuit which includes an input CMOS-inverter, of which the conductive channel of the PMOS-switch transistor is connected in series with NMOS load transistor means between an output node and a first power supply terminal, in accordance with the invention is characterized in that the N-MOS load transistor means substantially defines the load current when the PMOS-switch transistor is conductive. The N load transistor means is the principal element defining the load current. The PMOS-transistor of the input inverter merely acts as a switch and does not affect the load current. Consequently, the falling edge trip point is set by what is essentially a simple NMOS-transistor load (enhancement transistor) ratioed against the NMOS-transistor of the input inverter. The trip point can easily be estimated (or set) as is described in basic MOS-circuit textbooks.

A further embodiment of a CMOS-input circuit in accordance with the invention is characterized in that the NMOS-transistor of the input inverter is connected to a second power supply terminal via a further NMOS-transistor, of which the gate is connected to the input of the input inverter circuit, the node of the NMOS-transistor of the input inverter and of the further NMOS-transistor being connected via a feedback transistor device to the first power supply terminal, whereby the feedback transistor device is controlled by the output signal of the input inverter. The further embodiment of the CMOS-input circuit is a Schmidt trigger circuit, which inherently shows hysteresis, and renders the circuit less sensitive to noise on the input signal and to voltage bumps on the power supply leads due to transient currents.

A preferred embodiment of the CMOS-input circuit in accordance with the invention is characterized in that the output of the input-inverter is connected to the input of a first inverter circuit, the output of which is connected to an input of a second inverter circuit, of which the output is connected to a control input of the feedback transistor device. The feedback transistor device of the Schmidt trigger is not directly controlled by the conventional output point of the Schmidt trigger, but by the output of two serially connected inverters, which are controlled by the output signal on the conventional output of the Schmidt trigger for two reasons: (1) a voltage bump on the first power supply terminal can charge the conventional output node higher than normal giving an increase in the rising edge threshold point; and (2) and as the feedback transistor means is driven with a full logic swing, the rising edge trip point is easily estimated from the W/L ratio of the further NMOS-transistor and the feed back transistor means.

BRIEF DESCRIPTION OF THE DRAWING

The invention will be further elucidated by the way of examples of some embodiments of the CMOS-input circuit with reference to the accompanying drawing, in which.

DESCRIPTION OF THE PREFERRED EMBODIMENTS

Figure 1:
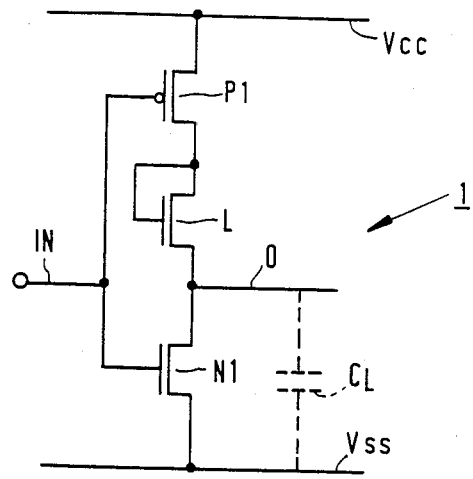
FIG. 1 shows a CMOS-input circuit in accordance with the invention.

In FIG. 1 a CMOS-input circuit 1 in accordance with the invention is shown, which comprises a PMOS-transistor P1, an NMOS-transistor N1 and an NMOS-transistor load L. The circuit 1 is connected to a first power supply terminal $V_{CC}$ (e.g. 5 V) to a second power supply terminal $V_{SS}$ (0 V). The PMOS-transistor P1 and the NMOS-transistor N1 constitute an input inverter and have their gates connected to an input load IN. The NMOS-transistor load L is connected as a diode and is in series with the conductive channel of the PMOS-transistor P1 between the first power supply terminal $V_{CC}$ and the output 0 of circuit 1. In CMOS-circuits only capacitive loads (CL) are on the outputs (0). In order to realize a CMOS-input circuit of which the characteristics are independent or substantially independent of PMOS-transistor characteristics the NMOS-transistor load is dimensioned in such a way that if the PMOS-transistor P1 is switched on the NMOS-transistor load L determines the load current flowing through the circuit 1 (said current may be the load current for charging capacity CL) or if the voltage on input IN is "high", which makes transistor N1 conductive, the load current may be a steady state current in the case that transistor P1 is not (fully) shut off due to an insufficient "high" level on the input IN (e.g. TTL-"high" level = 2.8 V, $V_{CC}$ being 5 V). In the shown circuit 1 the PMOS-transistor P1 merely acts as a switch.

Figure 2:
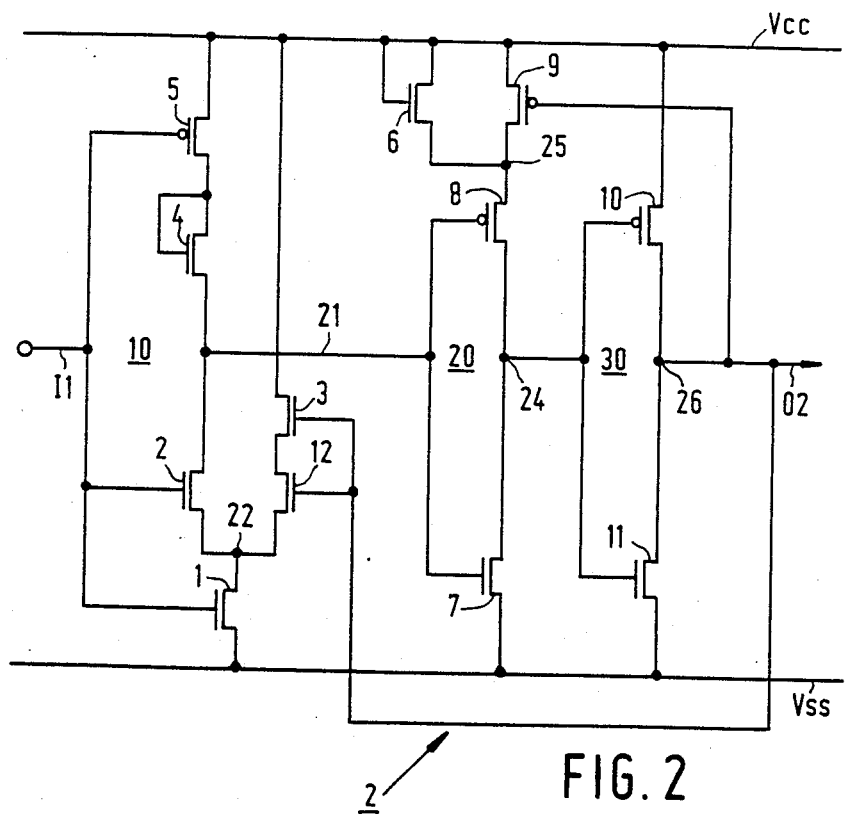
FIG. 2 shows a preferred embodiment of the CMOS-input circuit in accordance to the invention.

In FIG. 2 a preferred embodiment of a CMOS-input circuit 2 in accordance with the invention has been shown. The preferred embodiment comprises a Schmidt trigger circuit 10 and a first and a second inverter 20 and 30, respectively, each of which is connected to a first and a second power supply terminal $V_{CC}$, and $V_{SS}$ respectively. The Schmidt trigger 10 comprises an input inverter having a PMOS-transistor 5, an NMOS-transistor load 4 and an NMOS-transistor 2, which in fact constitute a same kind of circuit as shown in FIG. 1. The NMOS-transistor 2 is connected to the second supply terminal $V_{SS}$ via an NMOS-transistor 1. The drain of the transistor 2 is connected to the first power supply terminal $V_{CC}$ via two serially-connected transistors 3 and 12, of which the gates are connected to the output 02 of inverter 30 (for reason to be explained later on). It hould be noted that standard Schmidt trigger circuits have their output (in FIG. 2 node 21) connected to the gate of the feedback transistor device (in FIG. 2 transistors 3 and 12).

The circuit 2 as shown in FIG. 2 can be made very suitable for TTL-level input signals. By the way of an example dimensions of a TTL suitable circuit 2 in accordance with the invention has the following W/L-dimensions:

| transistor No. | W/L (μm) | transistor No. | W/L (μm) |
|---|---|---|---|
| 1 | 50/1.6 | 7 | 10/1.2 |
| 2 | 50/1.6 | 8 | 20/1.4 |
| 3 | 3/1.6 | 9 | 20/1.4 |
| 4 | 3/1.6 | 10 | 80/1.4 |
| 5 | 20/1.4 | 11 | 60/1.2 |
| 6 | 60/1.2 | 12 | 3/1.6 |

It should be noted that there is a very substantial difference in dimension width of the transistors 4 and 5, of which the small one is the NMOS-transistor load and the larger one is the PMOS-transistor switching element.

Figure 3:
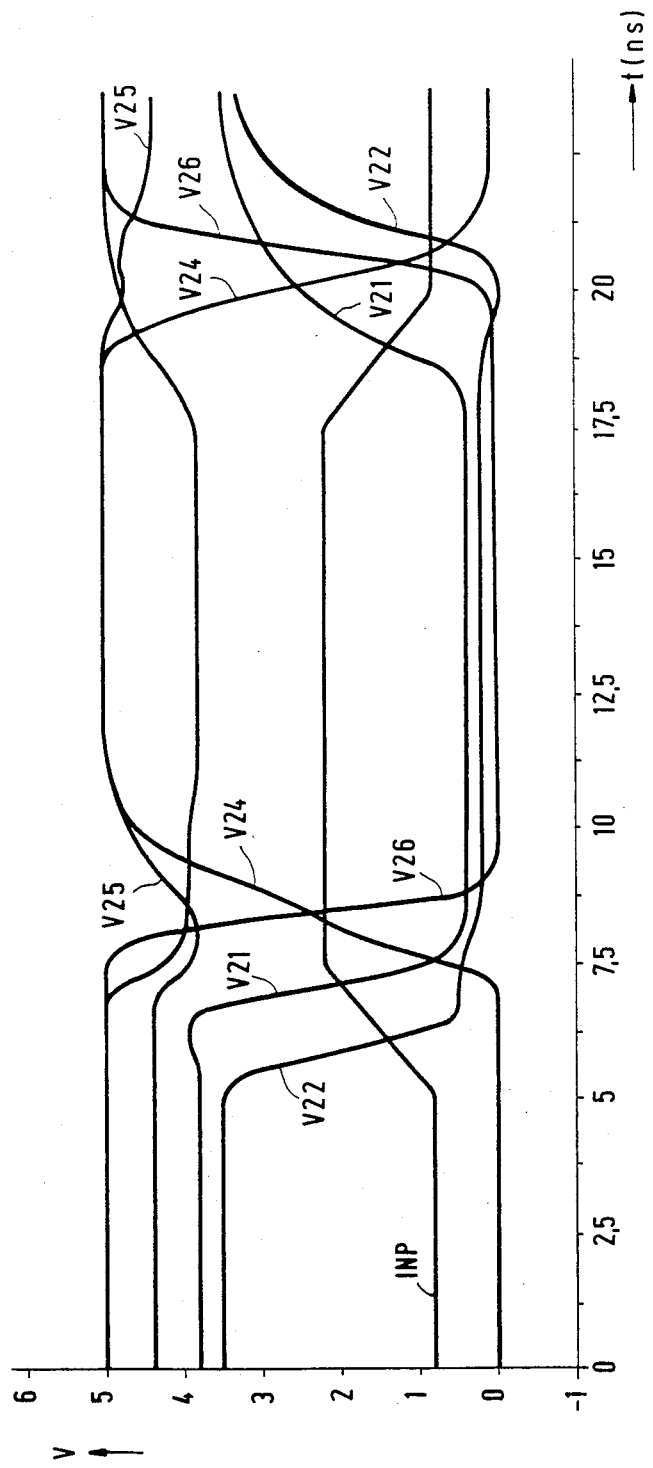
FIG. 3 shows voltage time diagrams of the CMOS-input circuit of FIG. 2.

The circuit 2 functions as follows. If the input signal INP is low (e.g. $\leq 0.8$ V) then the transistors 1 and 2 are non-conductive. So the voltage V21 on node 21 (output of the Schmidt trigger 10) is high ($V_{CC}$-VTH4) as can be seen in FIG. 3. The voltage V24 and V26 on the nodes 24 and 26 are low (0 V) and high (5 V = $V_{CC}$) respectively. The transistors 3 and 12 are controlled by the output 02 of circuit 2 and are conductive. The PMOS-transistor 9 is also controlled by the output 02 and is thus non-conductive. The voltage V25 on node 25 is therefore below $V_{CC}$ due to transistor 6.

If the input signal INP rises above the threshold voltage of transistor 1 then the voltage on node 22 will drop to a level determined by the resistances of the conducting transistors 1, 3 and 12 (e.g. 0.5 V, see FIG. 3). As soon as the input signal INP rises above V22+VTH2, of which the latter is the threshold voltage of transistor 2, then the voltage V21 on node 21 will decrease. The voltages V24 and V26 on nodes 24 and 26 will rise and fall respectively as soon as the voltage V21 and V24 go below and rise above the trip voltages of the inverters 20 and 30 respectively. As the output voltage V26 on node 26 goes low the transistors 3 and 12 are rendered non-conductive and as a result the voltage V22 on node 22 decreases towards 0 V ($\approx V_{SS}$). The output voltage V26 also controls transistor 9, which is made conductive as soon as voltage V26 drops below $V_{CC}$-VTH9 and then pulls voltage V25 up to $V_{CC}$ as shown in FIG. 3. Note that voltage V25 first decreases due to the current through transistor 6 at the moment that transistor 8 is made conductive. The transistors 6 and 9 are used to avoid a d.c. current path through inverter 20. The "high" output level of node 21 is one VTH4 (threshold voltage of transistor 4) below $V_{CC}$. The voltage V25 on node 25 is also one threshold voltage VTH6 below $V_{CC}$ thus rendering transistor 8 non-conductive.

If the input voltage INP goes from high to low then first the transistor 2 will be made non-conductive so that the voltage V22 on node 22 drops to zero ($=V_{SS}$) and that voltage V21 will rise. Further decrease of the input voltage INP will make transistor 1 non-conductive. Further, upon sufficient rise of voltage V21 the output voltages V24 and V26 of the inverters 20 and 30 respectively will drop and rise respectively. As a result the transistors 9 and 2 are made conductive as soon as the voltage V26 rises above the threshold voltage of transistor 12 and 3 so that the voltage V22 on node 22 will start to rise. Also, if the output 02 rises to a level above $V_{CC}$-VTH9 the transistor 9 is made non-conductive so that voltage V25 decreases to $V_{CC}$-VTH6. Note that voltage V25 already starts to decrease as soon as current is drawn by inverter 20, if its output node 24 is to be charged.

By correct choice of the size of the PMOS-transistor switch in the input circuit 10 the effect of variations in the PMOS device relative to the NMOS characteristics can be further reduced. By allowing the switch impedance (of transistor 5) to contribute to the total load impedance, the change in threshold voltage (trip-voltage) of the first inverter 20 (which divided by the input inverter gain is reflected to the input threshold voltage (trip-voltage of the input inverter)) can be largely cancelled.

What is claimed is:

1. A CMOS-input circuit, which includes an input CMOS-inverter having a PMOS-switch transistor and an NMOS-load transistor, wherein the conductive channel of the PMOS-switch transistor is connected in series with said NMOS-load transistor between an output node and a first power supply terminal, the NMOS-load transistor substantially defines the load current when the PMOS-switch transistor is conductive, a further NMOS-transistor, an NMOS-transistor of the input inverter being connected to a second power supply terminal via said further NMOS-transistor, the gate of said further transistor being connected to the input of the input inverter, a feedback transistor device, the common node of the NMOS-transistor of the input inverter and of the further NMOS-transistor being connected by said feedback transistor device to the first power supply terminal, and the feedback transistor device being controlled by the output signal of the input inverter.

2. A CMOS-input circuit as claimed in claim 1, characterized in that the output of the input inverter is connected to the input of a first inverter circuit, the output of which is connected to an input of a second inverter circuit, of which the output is connected to a control input of the feedback transistor device.

3. A CMOS-input circuit as claimed in claim 2, characterized in that the inverter circuits are CMOS-inverters.

4. A CMOS-circuit as claimed in claim 1, characterized in that the feedback transistor device comprises two NMOS-transistors in series, the gates of which are interconnected.

5. A CMOS-input circuit as claimed in claim 3, characterized in that the PMOS-transistor of the first inverter is connected to the first power supply terminal via an NMOS-transistor device, which is connected as a diode, and via a PMOS-transistor device, the gate electrode of which is connected to the output of the second inverter.

6. A CMOS-input circuit as claimed in claim 3 or 5, characterized in that the PMOS-transistor of the first inverter has substantially the same width/length-ratio as the PMOS transistor of the input inverter.

7. A CMOS-input circuit as claimed in claim 1, characterized in that the width/length ratio of the NMOS-load transistor is at most one fifth times the width/length ratio of the PMOS-switch transistor.

8. A CMOS-input circuit as claimed in claim 1, characterized in that the NMOS-load transistor is an NMOS-transistor which is connected as a diode.

* * * * *